United States Patent [19]
Kim et al.

[11] Patent Number: 5,677,232
[45] Date of Patent: Oct. 14, 1997

[54] METHODS OF FABRICATING COMBINED FIELD OXIDE/TRENCH ISOLATION REGIONS

[75] Inventors: Sung-eui Kim, Cheju-do; Soo-jin Hong, Seoul, both of Rep. of Korea

[73] Assignee: Samsung Electronics Co., Ltd., Suwon, Rep. of Korea

[21] Appl. No.: 754,889

[22] Filed: Nov. 22, 1996

[30]  Foreign Application Priority Data

Dec. 14, 1995 [KR] Rep. of Korea .................. 95-49687

[51] Int. Cl.$^6$ .................................................. H01L 21/76
[52] U.S. Cl. .................................................. 437/67; 437/69
[58] Field of Search .................................. 437/67, 69, 72; 148/DIG. 50, DIG. 85, DIG. 86, DIG. 117

[56]  References Cited

U.S. PATENT DOCUMENTS 4,873,203  10/1989  Kaga et al. .
5,028,559  7/1991  Zdebec et al. .
5,096,898  3/1992  Kawamura .

FOREIGN PATENT DOCUMENTS 0641022  3/1995  European Pat. Off. .

*Primary Examiner*—George Fourson
*Attorney, Agent, or Firm*—Bell, Seltzer, Park & Gibson

[57]  ABSTRACT

An isolation region is formed on a substrate by forming spaced apart mesas on the substrate. A first insulation region is then formed on the substrate and second insulation regions are formed on the mesas, the first insulation region being disposed between and spaced apart from a respective one of the mesas, a respective one of the second insulation regions capping a respective one of the mesas. Preferably, the first and second insulation regions are formed by forming sidewall spacers adjacent sidewall portions of the mesas and oxidizing portions of the mesas opposite the substrate and a portion of the substrate disposed between the sidewall spacers. Spaced apart trenches are formed in the substrate on opposite sides of the first insulation region, a respective one of the trenches being disposed between the first insulation region and a respective one of the mesas, preferably by removing the sidewall spacers and underlying portions of the substrate. An insulating layer is formed on the substrate, filling the trenches and covering the first insulation region, and the substrate is planarized to remove portions of the insulating layer and the second insulation regions and thereby expose underlying portions of the mesas and leave a third insulation region spanning the trenches.

14 Claims, 5 Drawing Sheets

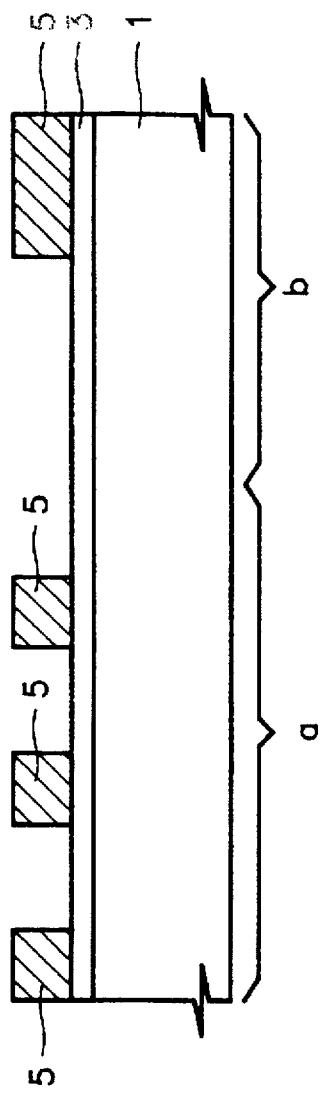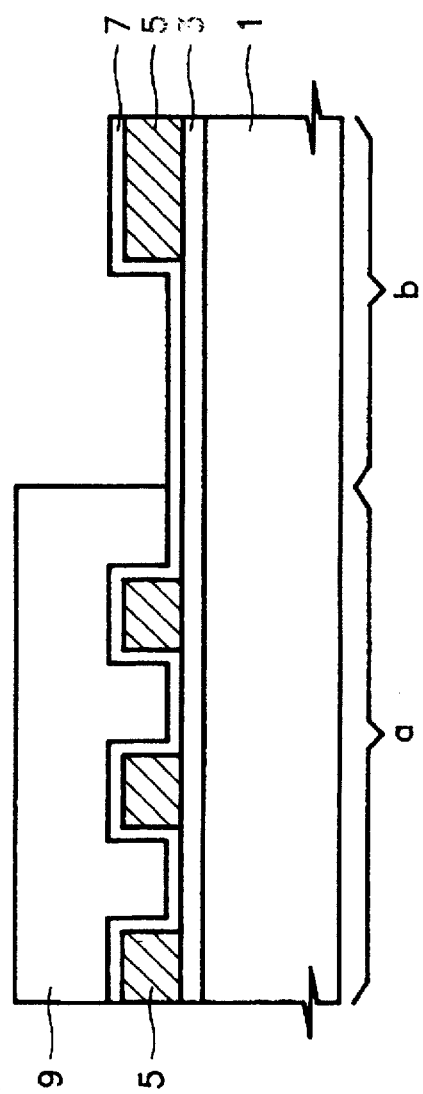

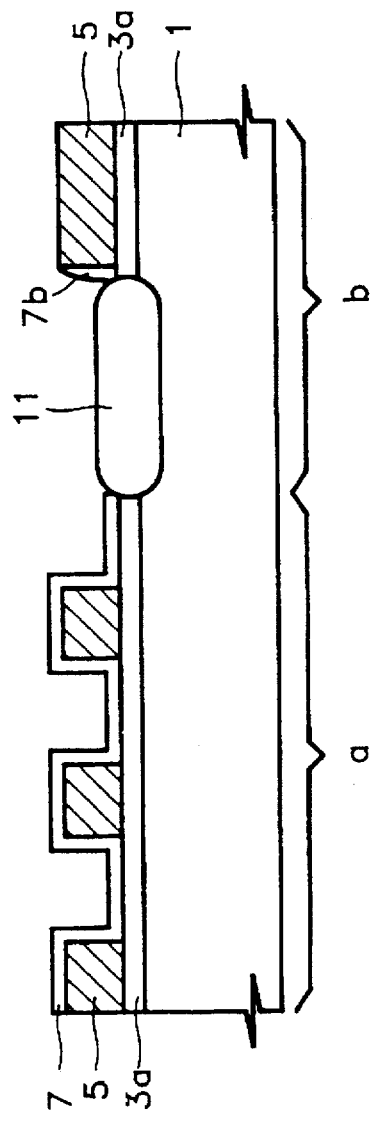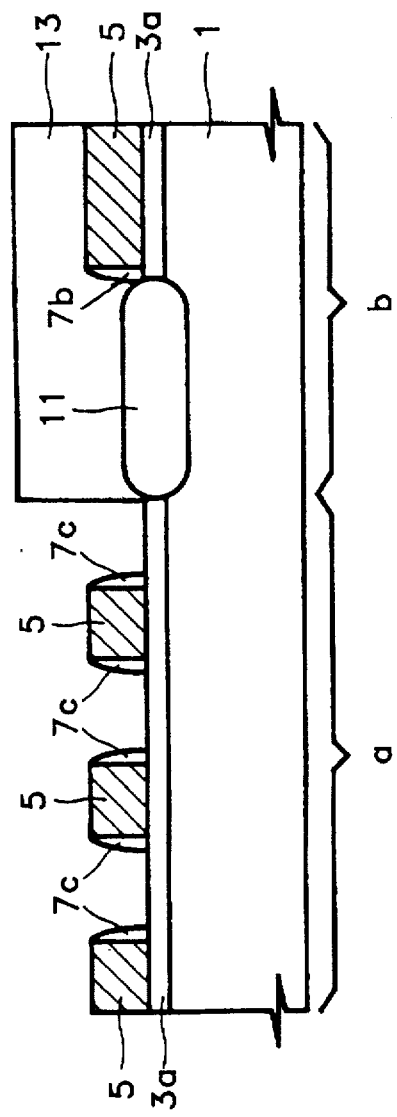

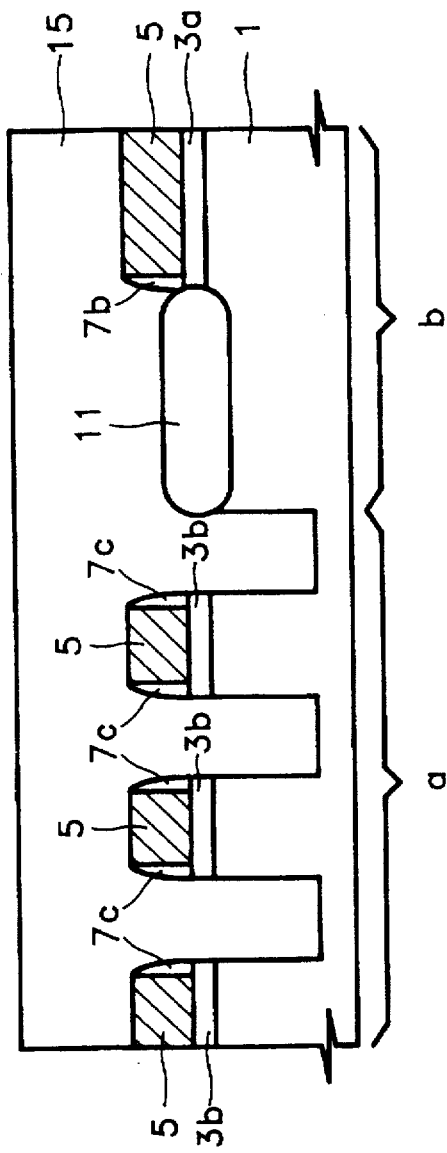
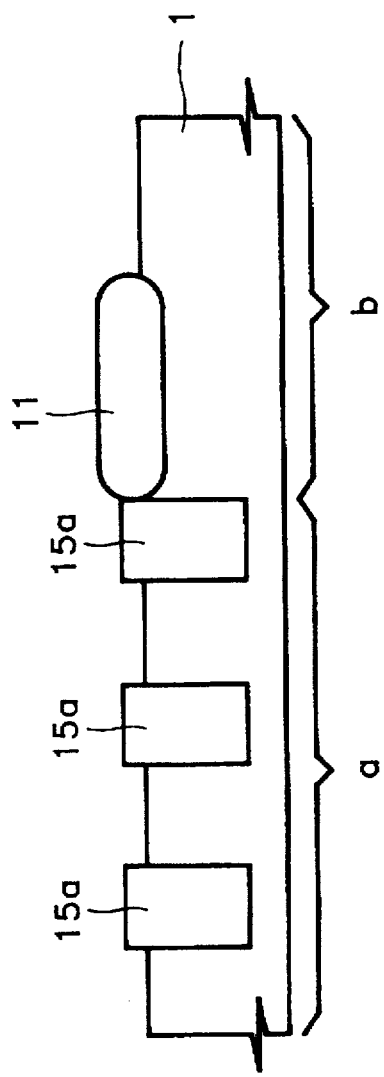

METHODS OF FABRICATING COMBINED FIELD OXIDE/TRENCH ISOLATION REGIONS

FIELD OF THE INVENTION

The present invention relates to microelectronic devices and methods of fabrication therefor, and more particularly to methods of forming isolation regions in microelectronic.

BACKGROUND OF THE INVENTION

As semiconductor devices become more highly integrated, the size of the individual transistors in the device tends to become smaller. Accordingly, it generally is important to reduce the area of the isolation regions used to isolate individual transistors.

One technique for fabricating isolation regions in semiconductor devices utilizes local oxidation silicon (LOCOS), in which thick field oxide layers are grown by thermal oxidation between active regions where devices are formed. A drawback of the LOCOS technique, however, is the formation of a bird's beak at the edges of device isolation regions. The bird's beak typically encroaches on active regions, thus making it generally inappropriate for highly integrated devices with narrow active regions. In addition, it may be difficult to achieve uniform oxide thickness across the substrate, because the field oxide tends to form more thickly in wide regions than in narrow regions.

Trench isolation techniques have been developed to solve some of the problems associated with LOCOS techniques. According to a typical trench isolation technique, trenches are etched into a silicon substrate and filled with an insulating material, thereby forming an isolation region. Unfortunately, trench isolation techniques may suffer from a dishing phenomena that may occur when the insulating layer is polished to form an isolation region. This dishing phenomena may be exacerbated on wide trenches.

Combined trench and field isolation regions have been proposed to deal with the particular problems associated with LOCOS and trench isolation techniques. These combined techniques generally involve using field isolation techniques to form wide isolation regions, e.g., in peripheral regions of memory circuits, and trench isolation techniques form narrow insulation regions, e.g., dense cell array regions of memory circuits.

FIGS. 1-6 illustrate a conventional combined trench/field isolation technique. A silicon dioxide and a first silicon nitride layers are sequentially formed on a semiconductor substrate 1. The first silicon nitride layer is then patterned by conventional photolithographic and etching techniques, to thereby form a first silicon nitride pattern 5, exposing a predetermined portion of the silicon dioxide layer 3. A second silicon nitride layer 7 is then formed on the surface of the substrate, typically to a thickness of approximately 200Å. A photoresist pattern 9 is then formed on the second silicon nitride layer 7, exposing a portion of the second silicon nitride layer 7 in a peripheral circuit region b, as illustrated in FIG. 2.

As illustrated in FIG. 3, the exposed second silicon nitride layer 7 is then anisotropically etched using the photoresist pattern 9 as an etching mask, thereby forming a first sidewall spacer 7b on a sidewall portion of the first silicon nitride pattern 5 in the peripheral circuit region b. The etching also exposes a portion of the silicon oxide film 3. The photoresist pattern 9 is then removed, and the resultant structure thermally oxidized, to form a field oxide region 11 on the exposed portions of the silicon oxide film 3.

Referring to FIG. 4, a second photoresist pattern 13 is formed covering the peripheral circuit region b, while leaving a cell array region a exposed. Using the second photoresist pattern 13 as an etching mask, remaining portions of the second silicon nitride layer 7 are anisotropically etched, forming spacers 7c on sidewall portions of the first silicon nitride pattern 5 and exposing portions of the silicon dioxide in the cell array region a.

As illustrated in FIG. 5, the exposed portions of the silicon dioxide layer 3 in the cell array region a are then anisotropically etched to expose the semiconductor substrate 1 thereunder. After the second photoresist pattern is removed, the exposed semiconductor substrate is then etched to a predetermined depth using the first silicon nitride pattern 5, the first spacer 7b, the second spacers 7c and the field oxide region 11 as an etching mask, thereby forming trench regions in the cell array region a. During the formation of the trenches, the silicon dioxide layer 3 is partitioned to form silicon dioxide regions 3b underlying the first silicon nitride pattern 5. An insulating layer 15 is then formed on the substrate, filling the trenches.

Referring now to FIG. 6, the insulating layer 15 is then etched back to expose the first silicon nitride film pattern 5, the first spacer 7b and second spacers 7c. The first silicon nitride pattern 5, the first spacer 7b and the second spacer 7c are then eliminated, typically using a phosphoric acid solution. The silicon dioxide patterns 3 are then eliminated, forming insulation regions 15a which fill the trenches in the cell array region a.

The conventional technique described above may require three or more separate photolithographic operations, thus complicating the process and increasing production costs. Because of the multiple photolithographic operations, misalignment may occur. Crystal defects may also occur at the interface of the semiconductor substrate 1 and the field oxide region 11, due to stress induced by the first sidewall spacer 7b and the first silicon nitride pattern 5. These crystal defects may lead to increased leakage currents between active regions contacting the field oxide region 11 and the semiconductor substrate 1.

SUMMARY OF THE INVENTION

In light of the foregoing, it is an object of the present invention to provide methods of fabricating isolation regions which require fewer photolithographic operations than convention techniques.

It is another object of the present invention to provide methods of fabricating isolation regions which produce fewer crystal defects than conventional techniques.

These and other objects, features and advantage are provided according to the present invention by methods of fabricating isolation regions in which spaced apart mesas are formed on a substrate, sidewall spacers are formed on sidewall portions of the mesas and used as an oxidation mask to form a first insulation region between the mesas, the sidewall spacers are removed and trenches formed thereunder, and a insulation region spanning the trenches and covering the first insulation region is formed by covering the substrate and filling the trenches with an insulating layer which is subsequently planarized. Preferably, the mesas are formed from polysilicon and the sidewall spacers are formed from silicon nitride, which can help reduce stress on the underlying substrate during thermal oxidation and thus help reduce the formation of crystal defects.

In particular, according to the present invention, an isolation region is formed on a substrate by forming spaced apart mesas on the substrate. A first insulation region is then formed on the substrate and second insulation regions are formed on the mesas, the first insulation region being disposed between and spaced apart from a respective one of the mesas, a respective one of the second insulation regions capping a respective one of the mesas. Spaced apart trenches are formed in the substrate on opposite sides of the first insulation region, a respective one of the trenches being disposed between the first insulation region and a respective one of the mesas. An insulating layer is formed on the substrate, filling the trenches and covering the first insulation region, and the substrate is planarized to remove portions of the insulating layer and the second insulation regions and thereby expose underlying portions of the mesas and leave a third insulation region spanning the trenches. Preferably, the first and second insulation regions are formed by forming sidewall spacers adjacent sidewall portions of the mesas and oxidizing portions of the mesas opposite the substrate and a portion of the substrate disposed between the sidewall spacers. The trenches may be formed by removing the sidewall spacers and underlying portions of the substrate to thereby form trenches in the substrate.

According to a first method aspect, the spaced apart mesas may be formed by forming an insulation layer on the substrate, forming a semiconductor layer on the insulation layer, and patterning the semiconductor layer and the insulation layer to form mesas including a semiconductor region on an insulation region. The sidewall spacers are then formed adjacent sidewall portions of the semiconductor and insulation regions of the mesas, leaving an exposed portion of the substrate therebetween, preferably by forming a barrier layer on the substrate, covering the mesas, and anisotropically etching the barrier layer to expose a portion of the substrate between the mesas and leave sidewall spacers adjacent sidewall portions of the mesas. Preferably, the substrate is silicon, the semiconductor layer is polysilicon, the insulation layer is silicon dioxide, and the barrier layer is silicon nitride. Reduced stress on the substrate during oxidation may thereby be provided, which can lead to a reduced number of crystal defects.

According to a second method aspect, the spaced apart mesas are formed by forming an insulation layer on the substrate, forming a semiconductor layer on the insulation layer, and patterning the semiconductor layer to form spaced apart semiconductor mesas on the insulation layer. The sidewall spacers are then formed on sidewall portions of the semiconductor mesas, leaving an exposed portion of the insulation layer disposed therebetween. A portion of the substrate underlying the exposed portion of the insulation layer disposed between the sidewall spacers is then oxidized to form the first insulation region. The sidewall spacers preferably are formed by forming a barrier layer on the substrate, covering the semiconductor mesas, and anisotropically etching the barrier layer to expose a portion of the insulation layer between the semiconductor mesas and leave sidewall spacers adjacent sidewall portions of the semiconductor mesas.

BRIEF DESCRIPTION OF THE DRAWINGS

Some of the objects and advantages of the present invention having been stated, others will be more fully understood from the detailed description that follows and by reference to the accompanying drawings in which:

FIGS. 1-6 are cross-sectional views of intermediate fabrication products illustrating operations for forming device isolation regions on a substrate according to the prior art.

DETAILED DESCRIPTION OF PREFERRED EMBODIMENTS

Figure 7:
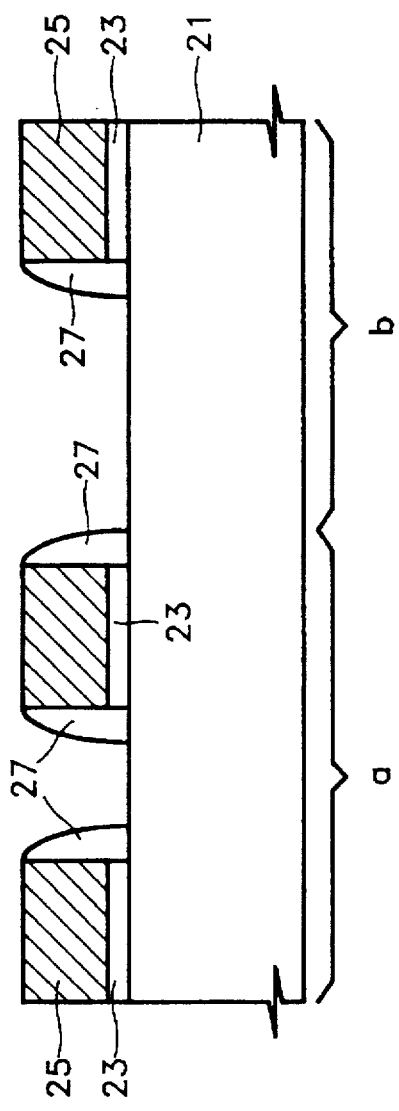
FIGS. 7-10 are cross-sectional views of intermediate fabrication products illustrating operations for forming device isolation regions on a substrate according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

FIGS. 7-10 are cross-sectional views of intermediate fabrication products illustrating operations for forming isolation regions according to the present invention. In FIGS. 7-10, a first region a corresponds to portions of a semiconductor device where narrow isolation regions are to be formed, for example a cell array region of a semiconductor memory device. A second region b corresponds to a portion of a semiconductor device having wider insulation regions, for example a peripheral circuit region of a semiconductor memory device.

Referring now to FIG. 7, a silicon dioxide layer and a polysilicon layer are sequentially formed on a semiconductor substrate 21. The polysilicon layer is then patterned to form spaced apart polysilicon mesas 25 on the silicon dioxide layer. At this time, the exposed portions of the silicon dioxide layer between the polysilicon mesas 25 may also be etched to expose the underlying portions of the substrate 21 and form silicon dioxide regions 23. A silicon nitride layer may then be formed on the substrate and anisotropically etched to form sidewall spacers 27 on sidewall portions of the mesas 25 and the silicon dioxide regions 23. Alternatively, the exposed portions of the silicon dioxide layer between the mesas 25 may be left unetched before application of the silicon nitride layer.

Figure 8:
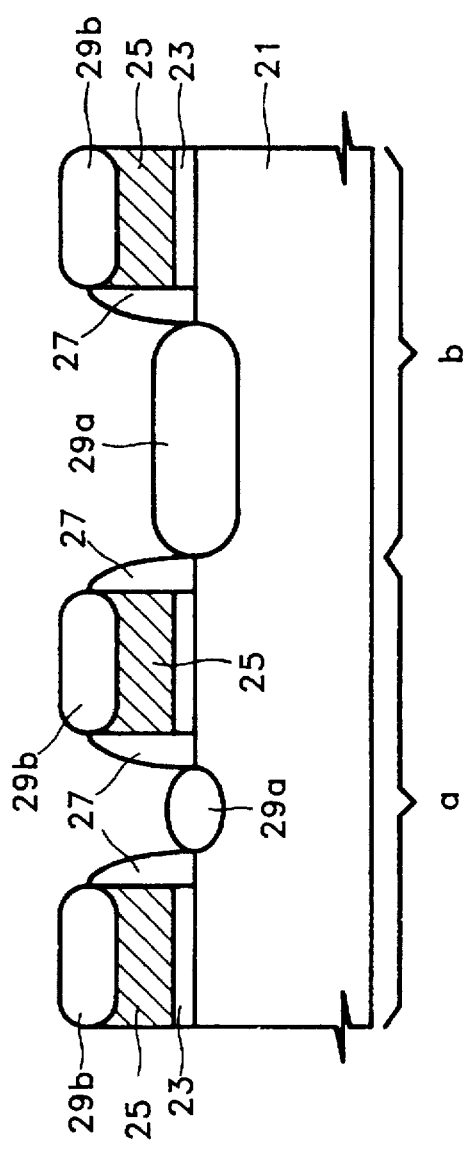

As illustrated in FIG. 8, exposed portions of the substrate 21 between the sidewall spacers 27 and top portions of the mesas 25 are then thermally oxidized to form first insulation regions 29a between the mesas, and second insulation regions 29b on the mesas 25. Because polysilicon is used for the mesas 25 instead of a conventional silicon nitride pattern, less stress may be generated at the interface of the first insulation regions 29a and the substrate 21, thus reducing the probability of crystal defects in this region. For example, a silicon nitride film having the thickness of approximately 1500Å, generates a tensile stress of approximately $2 \times 10^{10}$ dynes/cm$^2$, while a polysilicon film having a thickness of 4000Å generates a compressive stress of $4 \times 10^9$ dynes/cm$^2$. Because of the different types of stress generated by the silicon nitride and polysilicon regions, stress occurring during thermal processing of the substrate 21 can thus be relieved.

Figure 9:
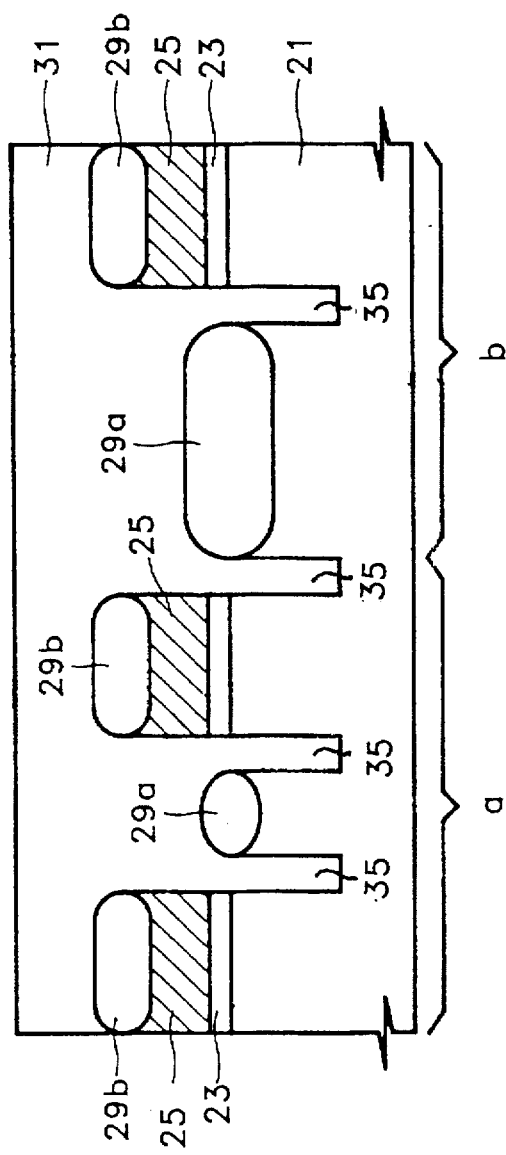

As illustrated in FIG. 9, the sidewall spacers 27 are then removed, preferably by etching with a phosphoric acid solution, thereby exposing portions of the semiconductor substrate 21 thereunder. The exposed portions of the substrate 21 are then etched to a predetermined depth using the first insulation regions 29a and the second insulation regions 29b as etching masks, thereby forming trenches 35 in the semiconductor substrate between the first insulation region 29b and a respective one of the mesas 25.

An insulating layer 31, for example a silicon dioxide film deposited using chemical vapor deposition (CVD), is then formed on the substrate, filling the trenches.

Figure 10:
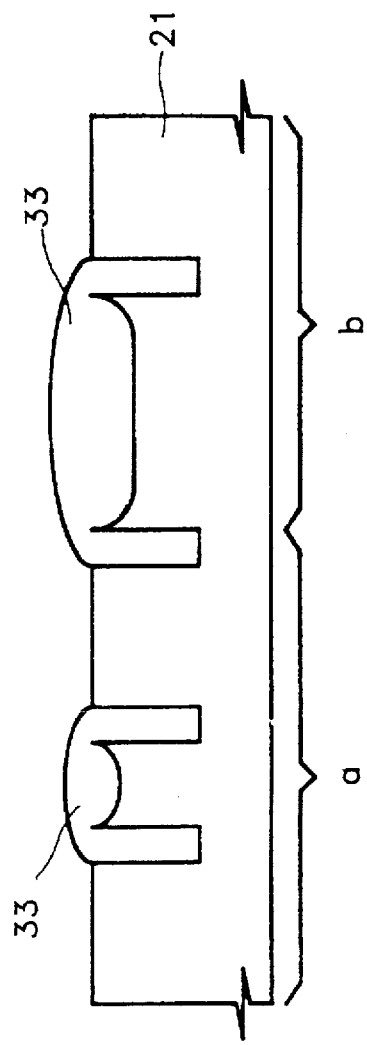

As illustrated in FIG. 10, the insulating layer 31 is then etched back, preferably using a chemical mechanical polishing (CMP) technique, until the polysilicon mesas 25 are exposed. Thus, a third insulation region 33 is formed spanning the trenches 35. The remaining portions of the polysilicon mesas 25 and the silicon dioxide regions 23 thereunder, may then be removed.

Those skilled in the art will appreciate that according to the present invention, isolation regions can be formed using a single photolithographic operation. Accordingly, device isolation regions can be fabricated more efficiently, and production costs can be reduced. In addition, the probability of formation of crystal defects in the surface of the semiconductor substrate adjacent the field isolation region can be greatly reduced, thereby reducing leakage current between active regions adjacent the field isolation region.

In the drawings and specification, there have been disclosed typical preferred embodiments of the invention and, although specific terms, are employed, they are used in a generic and descriptive sense only and not for purposes of limitation, the scope of the invention being set forth in the following claims.

That which is claimed:

1. A method of forming an isolation region on a substrate, the method comprising the steps of:
    forming spaced apart mesas on the substrate;
    forming a first insulation region on the substrate and second insulation regions on the mesas, the first insulation region being disposed between and spaced apart from a respective one of the mesas, a respective one of the second insulation regions capping a respective one of the mesas;
    forming spaced apart trenches in the substrate on opposite sides of the first insulation region, a respective one of the trenches being disposed between the first insulation region and a respective one of the mesas;
    forming an insulating layer on the substrate, filling the trenches and covering the first insulation region; and
    planarizing the substrate to remove portions of the insulating layer and the second insulation regions and thereby expose underlying portions of the mesas and leave a third insulation region spanning the trenches.

2. A method according to claim 1, wherein said step of forming first and second insulation regions comprises the steps of:
    forming sidewall spacers adjacent sidewall portions of the mesas; and
    oxidizing portions of the mesas opposite the substrate and a portion of the substrate disposed between the sidewall spacers to form the first insulation region and the second insulation regions.

3. A method according to claim 2 wherein said step of forming trenches comprises the step of removing the sidewall spacers and underlying portions of the substrate to thereby form trenches in the substrate.

4. A method according to claim 2:
    wherein said step of forming spaced apart mesas comprises the steps of:
        forming an insulation layer on the substrate;
        forming a semiconductor layer on the insulation layer; and
        patterning the semiconductor layer and the insulation layer to form spaced apart mesas on the substrate, the mesas including a semiconductor region on an insulation region;
    wherein said step of forming sidewall spacers comprises the step of forming sidewall spacers adjacent sidewall portions of the semiconductor and insulation regions of the mesas, leaving an exposed portion of the substrate therebetween; and
    wherein said step of oxidizing comprises the step of oxidizing the exposed portion of the substrate disposed between the sidewall spacers.

5. A method according to claim 4 wherein said step of forming sidewall spacers comprises the steps of:
    forming a barrier layer on the substrate, covering the mesas;
    anisotropically etching the barrier layer to expose a portion of the substrate between the mesas and leave sidewall spacers adjacent sidewall portions of the mesas.

6. A method according to claim 4 wherein said step of forming trenches comprises the steps of:
    removing the sidewall spacers and portions of the substrate thereunder to thereby form trenches in the substrate.

7. A method according to claim 2:
    wherein said step of forming spaced apart mesas comprises the steps of:
        forming an insulation layer on the substrate;
        forming a semiconductor layer on the insulation layer; and
        patterning the semiconductor layer to form spaced apart semiconductor mesas on the insulation layer;
    wherein said step of forming sidewall spacers comprises the step of forming sidewall spacers on sidewall portions of the semiconductor mesas, leaving an exposed portion of the insulation layer disposed therebetween; and
    wherein said step of oxidizing comprises the step of oxidizing a portion of the substrate underlying the exposed portion of the insulation layer disposed between the sidewall spacers.

8. A method according to claim 7 wherein said step of forming sidewall spacers comprises the steps of:
    forming a barrier layer on the substrate, covering the semiconductor mesas;
    anisotropically etching the barrier layer to expose a portion of the insulation layer between the semiconductor mesas and leave sidewall spacers adjacent sidewall portions of the semiconductor mesas.

9. A method according to claim 7 wherein said step of forming trenches comprises the steps of:
    removing the sidewall spacers and underlying portions of the insulation layer and the substrate to thereby form trenches in the substrate.

10. A method according to claim 1, further comprising the step of removing the mesas.

11. A method according to claim 1, wherein said step of forming spaced apart mesas uses a single photographic mask.

12. A method of forming an isolation region on a silicon substrate, the method comprising the steps of:
    forming spaced apart polysilicon mesas on the substrate;
    forming spaced apart silicon nitride spacers on sidewall portions of the polysilicon mesas;

oxidizing exposed portions of the polysilicon mesas and portions of the substrate between the silicon nitride spacers to form a first silicon dioxide region on the substrate and second silicon dioxide regions on the mesas, the first silicon dioxide region being disposed between and spaced apart from a respective one of the mesas, a respective one of the second silicon dioxide regions capping a respective one of the mesas;

removing the silicon nitride spacers and underlying portions of the substrate to form spaced apart trenches in the substrate on opposite sides of the first insulation region, a respective one of the trenches being disposed between the first silicon dioxide region and a respective one of the mesas;

forming an insulating layer on the substrate, filling the trenches and covering the first silicon dioxide region; and planarizing the substrate to remove portions of the insulating layer and the second silicon dioxide regions and thereby expose underlying portions of the mesas and leave an insulation region spanning the trenches.

13. A method according to claim 12:

wherein said step of forming spaced apart polysilicon mesas comprises the steps of:

forming a silicon dioxide layer on the substrate;

forming a polysilicon layer on the silicon dioxide layer; and patterning the polysilicon layer and the silicon dioxide layer to form spaced apart mesas, each including a polysilicon region and a silicon dioxide region;

wherein said step of forming silicon nitride spacers comprises the step of forming silicon nitride spacers adjacent sidewall portions of the polysilicon and silicon dioxide regions of the mesas, leaving an exposed portion of the substrate therebetween; and wherein said step of oxidizing comprises the step of oxidizing the exposed portion of the substrate disposed between the silicon nitride spacers.

14. A method according to claim 12:

wherein said step of forming spaced apart polysilicon mesas comprises the steps of:

forming a silicon dioxide layer on the substrate;

forming a polysilicon layer on the silicon dioxide layer; and patterning the polysilicon layer to form spaced apart semiconductor mesas on the silicon dioxide layer;

wherein said step of forming silicon nitride spacers comprises the step of forming silicon nitride spacers on sidewall portions of the polysilicon mesas, leaving an exposed portion of the silicon dioxide layer disposed therebetween; and wherein said step of oxidizing comprises the step of oxidizing a portion of the substrate underlying the exposed portion of the silicon dioxide layer disposed between the silicon nitride spacers.

* * * * *